(12) United States Patent
Terada (10) Patent No.: US 9,024,275 B2
(45) Date of Patent: May 5, 2015

(54) SPECIMEN HOLDER FOR CHARGED-PARTICLE BEAM APPARATUS

(75) Inventor: Shohei Terada, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 13/816,601

(22) PCT Filed: Aug. 16, 2011

(86) PCT No.: PCT/JP2011/068560
§ 371 (c)(1),
(2), (4) Date: Feb. 12, 2013

(87) PCT Pub. No.: WO2012/026365
PCT Pub. Date: Mar. 1, 2012

(65) Prior Publication Data
US 2013/0140458 A1    Jun. 6, 2013

(30) Foreign Application Priority Data
Aug. 27, 2010   (JP) .................................. 2010-190555

(51) Int. Cl.
*H01J 37/20* (2006.01)
*H01J 37/26* (2006.01)

(52) U.S. Cl.
CPC ................ *H01J 37/20* (2013.01); *H01J 37/26* (2013.01); *H01J 2237/0216* (2013.01)

(58) Field of Classification Search
USPC .................................................. 250/440.11
See application file for complete search history.

(56) References Cited

U.S. PATENT DOCUMENTS

| 3,521,056 | A | * | 7/1970 | Suzuki ..................... 250/442.11 |
| 3,643,091 | A | * | 2/1972 | Lucas ...................... 250/442.11 |
| 5,296,669 | A | * | 3/1994 | Kobayashi et al. ........... 219/201 |
| 5,367,171 | A | * | 11/1994 | Aoyama et al. ............ 250/443.1 |

(Continued)

FOREIGN PATENT DOCUMENTS

| EP | 2 293 319 A1 | 3/2011 |
| JP | 4-129149 A | 4/1992 |

(Continued)

OTHER PUBLICATIONS

Wikipedia—Theory of Elasticity.*

(Continued)

*Primary Examiner* — Phillip A Johnston
*Assistant Examiner* — Sean Luck
(74) *Attorney, Agent, or Firm* — Crowell & Moring LLP (57) ABSTRACT

The present invention realizes a specimen holder for a charged-particle beam apparatus capable for moving at least one specimen support, and for obtaining the image of the transmission electron microscopy, or the like of all specimens arranged in the specimen holder with high spatial resolution. The retainer plates are put on the specimen supports after the specimen supports are set on the specimen stages at the end portion of the specimen holder respectively. Thereafter, the specimen supports and the retainer plates are fixed to the specimen stages. The vibration damping mechanism is arranged on the end portion side of the specimen holder. The vibration of the specimen support can be prevented or restricted by the condition that the vibration damping mechanism contacts to the specimen support. Accordingly, the transmission electron microscopy image can be obtained with high spatial resolution power.

5 Claims, 9 Drawing Sheets

(56) References Cited

U.S. PATENT DOCUMENTS

| | | | |
|---|---|---|---|
| 6,388,262 B1* | 5/2002 | Alani et al. | 250/442.11 |
| 6,836,093 B1 | 12/2004 | Nishi | |
| 7,395,727 B2* | 7/2008 | Moore | 73/866.5 |
| 7,476,872 B2* | 1/2009 | Terada et al. | 250/442.11 |
| 7,705,324 B2* | 4/2010 | Miyazaki et al. | 250/442.11 |
| 7,759,656 B1* | 7/2010 | Walck et al. | 250/440.11 |
| 8,101,924 B2 | 1/2012 | Hamochi | |
| 2005/0061971 A1* | 3/2005 | Terada et al. | 250/307 |
| 2005/0230636 A1* | 10/2005 | Tanaka et al. | 250/440.11 |
| 2006/0169916 A1* | 8/2006 | Schneider | 250/440.11 |
| 2006/0289784 A1* | 12/2006 | Deguchi et al. | 250/441.11 |
| 2008/0083884 A1* | 4/2008 | Kishimoto et al. | 250/442.11 |
| 2008/0250881 A1* | 10/2008 | Dona | 73/864.91 |
| 2009/0014664 A1* | 1/2009 | Moriya | 250/442.11 |
| 2009/0302234 A1* | 12/2009 | Terada et al. | 250/442.11 |
| 2010/0193398 A1* | 8/2010 | Marsh et al. | 206/710 |
| 2011/0155906 A1 | 6/2011 | Terada et al. | |

FOREIGN PATENT DOCUMENTS

| | | |
|---|---|---|
| JP | 8-87972 A | 4/1996 |
| JP | 10-302700 A | 11/1998 |
| JP | 11-233054 A | 8/1999 |
| JP | 2004-241255 A | 8/2004 |
| JP | 2007-80668 A | 3/2007 |
| JP | 2010-9943 A | 1/2010 |
| JP | 2010-44999 A | 2/2010 |
| JP | 2010-157491 A | 7/2010 |
| WO | WO 00/16371 A1 | 3/2000 |
| WO | WO 2009/157358 A1 | 12/2009 |

OTHER PUBLICATIONS

Wikipedia—Hookes Law.*
Wikipedia—Springboard.*
Hyperphysics.com Springs http://hyperphysics.phy-astr.gsu.edu/hbase/permot2.html.*
Corresponding International Search Report with English Translation dated Nov. 22, 2011 (five (5) pages).
Japanese-language Written Opinion dated Nov. 22, 2011 (PCT/ISA/237) (four (4) pages).
Notification of Transmittal of Translation of the International Preliminary Report on Patentability (PCT/IB/338) and International Preliminary Report on Patentability (PCT/IB/373), including English translation of Written Opinion (PCT/ISA/237) dated Mar. 28, 2013 (eight (8)) pages).
Extended European Search Report dated Feb. 28, 2014 (nine (9) pages).

* cited by examiner

FIG. 1

ENERGY DISPERSIVE AXIS

⊗ Y AXIS

FIG. 2A

TRANSMISSION ELECTRON
MICROSCOPY IMAGE

FIG. 2B

SPECTRUM IMAGE

FIG. 2C

ELECTRON ENERGY LOSS SPECTRUM
OBTAINED AT EACH PLACE

SPECIMEN HOLDER FOR CHARGED-PARTICLE BEAM APPARATUS

TECHNICAL FIELD

The present invention relates to a specimen holder used for a charged-particle beam apparatus.

BACKGROUND ART

The processed dimensions of a semiconductor device, a magnetic device, or the like become to be fined and highly integrated, and the deterioration and the lowering of the reliability of the characteristics of the devices become to be an important problem more than up to this time. In recent years, not only an image observation but also a crystal structure analysis, a spectrum analysis and a two-dimensional elemental distribution analysis are necessary analysis means in order to analyze a failure of a semiconductor device in nano-meter region for basically ascertaining and solving the cause of the failure at development of new process and mass production. The image observation is executed by using a (Scanning) Transmission Electron Microscopy ((S) TEM) which is a charged-particle apparatus, the crystal structure analysis being executed by an electron diffraction, the spectrum analysis and the two-dimensional elemental distribution analysis being executed by using the Electron Energy Loss Spectroscopy (EELS), the Energy Dispersive X-ray spectroscopy (EDX), or the like.

Further, the remarkable improvement of characteristics of the material is desired more than up to this time for an energy environment material, such as a positive electrode of a lithium ion battery, or the like.

The structure in nano meter level and the control of chemical bond condition are very important keys in order to improve the characteristics of the materials. Therefore, the need of the above-mentioned analysis techniques increases.

In a prior art, when electron energy loss spectrum is obtained at the different positions on a specimen, the scanning transmission electron microscopy, which scans on the specimen by using the restricted small electron beam controlled by a scanning coil, and an electron spectroscope, which is capable for obtain spectrum by using the energy quantity included in the electron beam, are combined to obtain the spectrum of the electron beam permeating the specimen, so that electron energy loss spectrum is obtained continuously.

However, in this procedure, the aberration and the origin position of the electron energy loss spectrum are changed by the drift of an electron beam acceleration voltage and the change of magnetic field and electric filed induced with the change of outer disturbance in circumference of the apparatus, so that it is difficult to compare the shapes of an energy loss near-edge structure of the electron energy loss spectrum and small chemical shifts in each measurement point with each other.

Therefore, for example, patent document 1 describes that an electron spectroscope is included in the above-mentioned scanning transmission electron microscopy to make the focus points at X axis and Y axis to be different with each other to obtain a two dimensional image having a spectrum surface including a focus point position of the X axis and an image surface including a focus point position of the Y axis by using an image detector.

As a result, the electron energy loss spectrum in the Y axis direction of the specimen can be observed separately, and the energy loss near edge structure of the electron energy loss spectrum and small chemical shift at the different positions can be compared with each other in detail.

The spectrum image having the energy loss quantity in X axis and the position information of the specimen in Y axis as described in the patent document 1 is a two dimensional image obtained by the image detector in case that the lens action of the electron spectroscope or the like is changed and made the focus points of X axis and Y axis to be different with each other. Namely, the electron energy loss spectrums of the different point of the specimen can be observed at the same time.

The patent document 1 discloses the technique for discussing the chemical shift induced by the difference of the chemical bond conditions by obtaining the spectrum images, that is, the electron energy loss spectrums from the plural different points in one specimen.

A specimen holder for transmission electron microscopy is required for measuring the electron energy loss spectrum and the chemical shift by using the transmission electron microscopy.

The patent document 2 discloses the specimen holder for a transmission electron microscopy capable for measuring the electron energy loss spectrum and the chemical shift by obtaining plural spectrum images from the plural specimens.

The specimen holder for a transmission electron microscopy disclosed in the patent document 2 includes a specimen stage capable for arranging the plural specimen supports. Further, the plural specimen supports can be moved by at least one specimen stage driving mechanism to approach the plural specimen supports with each other.

On the other hand, in a specimen holder for the transmission electron microscopy, the patent documents 3 and 4 disclose the apparatus capable of observing the specimen with the reduced effect of the outer vibration.

PRIOR ART DOCUMENTS

Patent Document

Patent Document 1: JP-A-10-302700
Patent Document 2: JP-A-2010-009943
Patent Document 3: JP-A-11-233054
Patent Document 4: JP-A-2007-080668

SUMMARY OF THE INVENTION

Problems to be Solved by the Invention

Although the specimen holder for the transmission electron microscopy disclosed in the patent document 2 is capable for obtaining spectrum images from the plural specimens at the same time and for measuring the electron energy loss spectrum and chemical shift, the movable specimen stage having a cantilever structure, the drift of the specimen being induced by the effect of the vibration or the like. It is difficult to observe the specimen on the movable specimen stage with high spatial resolution.

Further, the techniques disclosed in the patent documents 3 and 4 are countermeasures of vibration for the specimen support set on the specimen stage which is impossible to move in the specimen holder, being not the counter measures of vibration for the specimen support set on the specimen stage which can move in the specimen holder. Accordingly, it is difficult to execute the observation or the like for the specimen on the specimen support set at the specimen stage capable for moving at high spatial resolution.

An object of the present invention to realize a specimen holder for a charged-particle apparatus having at least one movable specimen support on which the plural specimens are arranged, and the image of the transmission electron microscopy, the image of an electron diffraction, and the image of spectrum or the like can be obtained from all specimens arranged in the specimen holder.

Means for Solving the Problems

In order to attain the above-mentioned object, the present invention is constructed as follows:

Namely, a specimen holder for a charged-particle beam apparatus according to the present invention comprises a specimen support on which a plurality of specimens are arranged, a specimen driving section for moving the specimen support, and a vibration restricting mechanism for restricting the vibration of the specimen support.

Effects of the Invention

According to the present invention, the present invention can realize a specimen holder for a charged-particle beam apparatus capable for moving at least one specimen support on which a plurality of specimens are arranged, and for obtaining the image of the transmission electron microscopy, the image of an electron diffraction, and the image of spectrum or the like from all specimens arranged in the specimen holder with high spatial resolution.

MODE FOR CARRYING OUT THE INVENTION

The embodiments of the present invention will be described herein under with reference to the accompanying drawings. In all drawings for explaining the embodiments, the same member is represented by the same reference numeral in principle to omit the repeated explanation.

Embodiments

Figure 1:
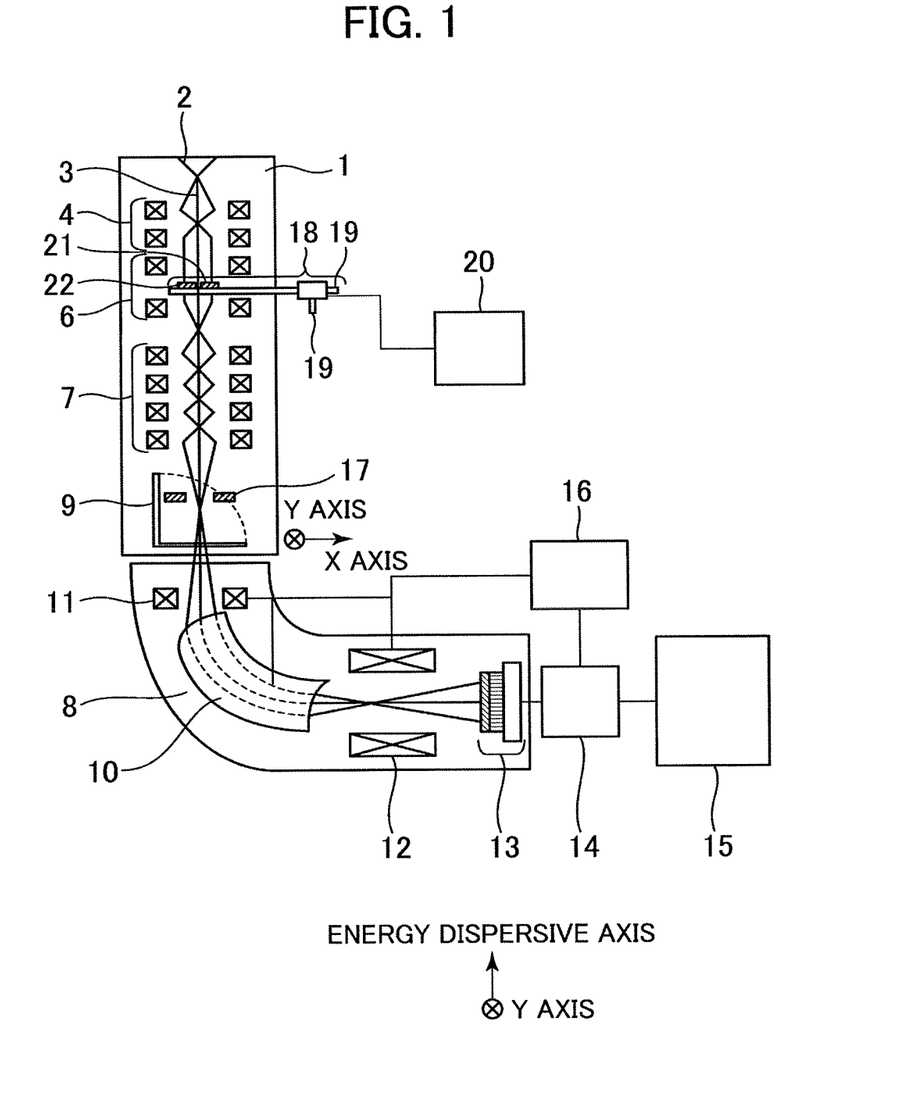
FIG. 1 is a diagrammatic construction drawing of a transmission electron microscopy to which one embodiment of the present invention is applied.

FIG. 1 is a whole diagrammatic construction drawing of a transmission electron microscopy to which the first embodiment of the present invention is applied. The present invention will be explained herein under in case that an example of the present is applied to a specimen holder for a transmission electron microscopy. The present invention can be applied to specimen holders of a charged-particle apparatus, such as a scanning electron microscopy, a scanning tunneling microscopy, a focused ion beam apparatus, or the like.

In FIG. 1, a Transmission Electron Microscopy apparatus 1 includes an electron spectroscope 8. Further, the transmission electron microscopy 1 includes an electron source 2 for emitting an electron beam 3, a convergent lens 4, an objective lens 6, an image lens system 7 (image lens), a fluorescent screen 9, an image display apparatus 14, a data storage apparatus 15, and a central control apparatus 16.

A specimen holder 18 for a transmission electron microscopy (specimen holder) supporting plural specimens 21 and 22 is arranged between the convergent lens 4 and the objective lens 6. The specimens 21 and 22 are fixed to the specimen support, being arranged in the specimen holder 18.

The electron spectroscope 8 includes a magnetic sector 10, multiple lenses 11, 12, and an image detector 13.

The constructions of the transmission electron microscopy 1 and the electron spectroscope 8 are not limited to this embodiment. Further, the position for arranging the electron spectroscope 8 is not limited specially. In the first embodiment of the present invention, the electron spectroscope 8 is arranged between the fluorescent screen 9 and the image display apparatus 14. The electron spectroscopy 8 may be arranged in the image lens system 7.

In the transmission electron microscopy 1, the electron beam 3 emitted from the electron source 2 passes though the convergent lens 4, being irradiated to the specimens 21 and 22. The electron beam 3 through the specimens 21 and 22 passes though the plural image lenses system 7. The electrons beam 3 goes into the electron spectroscope 8 directly in case that the fluorescent screen 9 is opened.

The electron beam 3 into the electron spectroscope 8 passes through the magnetic sector 10 capable for making spectrum by the quantity of energy included in the electron beam 3 and the multiple pole lens 11, 12 used for reducing the aberration of the electron energy loss spectrum in the electron spectroscope 8. Thereafter, the electron beam 3 is shot as a transmission electron scope image, a two-dimensional elemental distribution image, a spectrum image, or the like by the image detector 13. Thereafter, the two dimensional image of the specimen is displayed on the image display apparatus 14, being stored in the data storage apparatus 15.

Further, the magnetic sector 10 and the multiple lenses 11 and 12 are controlled by the central control apparatus 16. The central control apparatus 16 can control the operation of switching the obtaining modes for obtaining the transmission electron microscopy image, the two-dimensional elemental image, and the spectrum image.

The image detector 13 can be arranged on a place just under the fluorescent screen 9, so that the image detector 13 can obtain the transmission electron microscopy image and the electron diffraction image before the electron beams goes into the electron spectroscope. When the electron beam 3 is required to be entered into the electron spectroscope 8, the image detector 13 can be removed from the passage of the electron beam 3.

If the spectrum image is obtained, a filed view restriction slit 17 may be inserted in the passage of the electron beam to restrict the spectrum obtaining position, the field view restriction slit 17 being short in the same direction of the X axis direction, that is, the energy dispersion axis, the field view restriction slit 17 being long in the Y axis direction, that is, the specimen measuring position direction.

The specimen holder 18 includes a coarse driving part 19 capable for moving the specimen in a wide area. Further, the specimen holder 18 is connected to a specimen moving apparatus 20 for adjusting the position of the specimen holder 18 in order to move the specimen holder for the desired position certainly.

At least one of the specimens 21 and 22 can be moved X, Y, and Z axis's directions (the directions shown in FIG. 1, Z axis is the direction perpendicular to X axis and Y axis) in independently by the coarse driving part 19 and the specimen moving apparatus 20, being moved at any time in order to obtain the electron energy loss spectrum of the specimens 21 and 22 at the same time. The positions of the specimens 21 and 22 can be confirmed by the fluorescent screen 9 and image display apparatus 14.

The method for measuring the electron energy loss spectrum by using the transmission electron microscopy 1 will be described.

The electron energy loss spectrum can be roughly classified into a zero loss spectrum with no energy loss when the electron beam passes though the specimens 21 and 22, a plasmon loss spectrum obtained by the energy loss of the excitation of the electron in the valance electron band, and an inner-shell electron excitation loss spectrum obtained by the energy loss of the excitation of inner-shell electrons. In the inner-shell electron excitation loss (core loss), a fine structure is observed at vicinity of the energy loss near-edge structure.

This structure is called to Energy Loss Near-Edge Structure (ELNES), having the information reflected by the electron condition and the chemical bond condition of the specimen. Further, since the value of the energy loss (energy loss near-edge position) is inherent in the element, the qualitative analysis can be executed. Further, the information related to the configuration vicinity of the remark element can be obtained by the energy loss near-edge position shift so called a chemical shift: simple condition analysis can be executed. As a result, the electron energy loss spectrum of the specimen in the Y axis direction can be separated and observed.

Figure 2A:
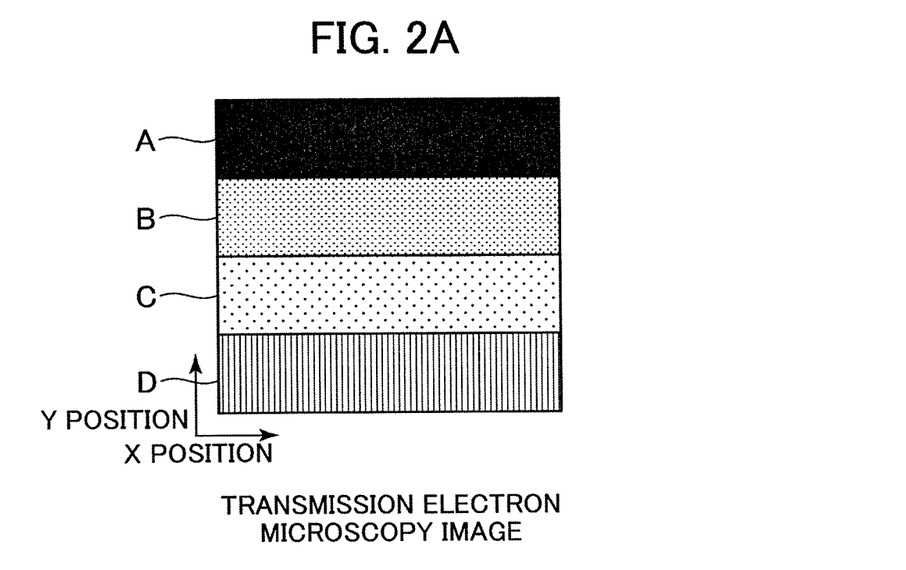
FIG. 2A is a drawing for explaining the transmission electron microscopy image obtained by the transmission electron microscopy.
Figure 2B:
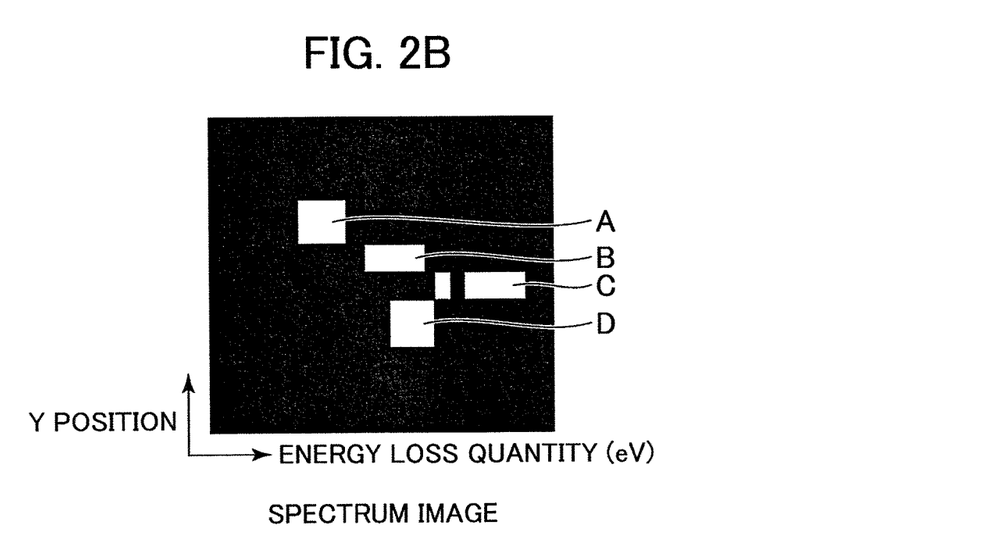
FIG. 2B is a drawing for explaining a spectrum image obtained by the transmission electron microscopy.
Figure 2C:
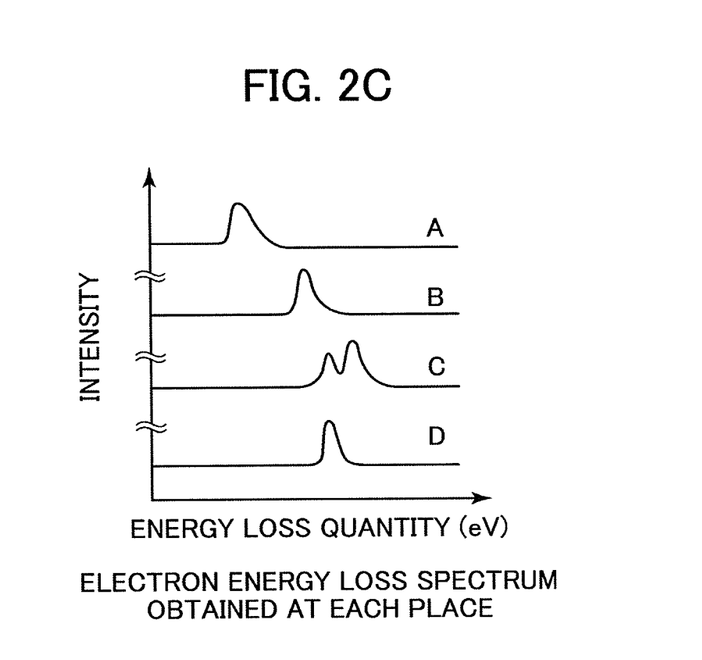
FIG. 2C is a drawing for explaining an electron energy loss spectrum obtained by the transmission electron microscopy.

Namely, X axis of the image obtained by the image detector 13 can be observed as the energy loss quantities, that is, the energy dispersion axis, and Y axis of the image obtained by the image detector 13 can be observed as the spectrum image including information of the position of the specimen, as shown in FIG. 2B. The spectrum image is observed as the bands A to D corresponding to each lamination membrane of the transmission electron microscopy image shown in FIG. 2A. Further, the electron energy loss spectrums of the lamination of each layer of the different position of the specimen can be observed at the same time, as shown in FIG. 2C, by extracting the intensity profile of the spectrum image at each position corresponding to each lamination layer membrane from the transmission electron microscopy image shown in FIG. 2A. The energy losses near-edge structure of the electron energy loss spectrum and small chemical shifts at the different positions can be compared with each other in detail.

Next, the specimen holder of the first embodiment of the present invention will be descried.

Figure 3:
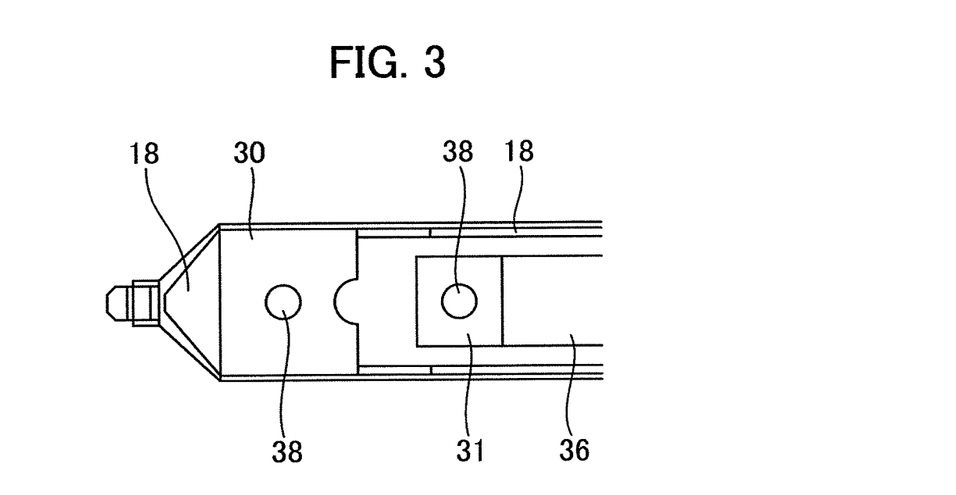
FIG. 3 shows a specimen holder of one embodiment of the present invention, being a drawing of a diagrammatic upper surface of the specimen holder for the transmission electron microscopy on which a vibration isolation mechanism is not set.

FIG. 3 is a drawing for showing an enlarged upper surface of the end portion of the specimen holder 18 shown in FIG. 1, showing the end portion of the specimen holder 18 on which the specimen supports 40 and 41 (which will be described herein after) for fixing the specimen are not set.

Specimen stages 30 and 31 for setting the specimen supports 40 and 41 on which the specimens 21 and 22 are fixed are mounted to the end portion of the specimen holder 18. The specimen stage 30 is integrated with the specimen holder 18 for the transmission electron microscopy, and the specimen cannot be moved in the specimen holder 18.

On the other hand, the specimen stage 31 is arranged on the end portion of a specimen driving rod 36. The specimen driving rod 36 can be moved in each axis direction by the coarse driving part 19 and the specimen moving apparatus 20. Further, screw holes 38 are formed to the specimen stages 30 and 31.

Figure 4:
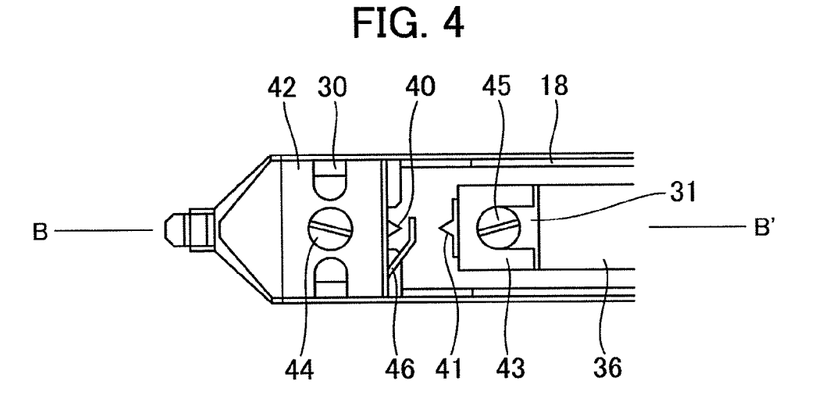
FIG. 4 shows the specimen holder for the transmission electron microscopy of one embodiment of the present invention, being a drawing of a diagrammatic upper surface of the specimen holder for the transmission electron microscopy on which a vibration isolation mechanism and specimen supports are set.

FIG. 4 is a drawing for showing an enlarged upper surface of the end portion of the specimen holder 18 shown in FIG. 1, showing the end portion of the specimen holder 18 on which the specimen supports 40 and 41 are set, as shown in FIG. 3.

In FIG. 4, after the specimen supports 40 and 41 are set on the specimen stages 30 and 31 on the end portion of the specimen holder 18 respectively, retainer plates 42 and 43 being mounted on the specimen supports 40 and 41. Thereafter, both of the specimen supports 40 and 41 and the retainer plates 42 and 43 are fixed to the specimen stages 30 and 31 by fixing screws 44 and 45. Further, a damping mechanism 46 is arranged on the side of the end portion of the specimen holder 18. The method for fixing the specimen supports 40 and 41 is not limited to the example shown in the drawings.

Figure 5:
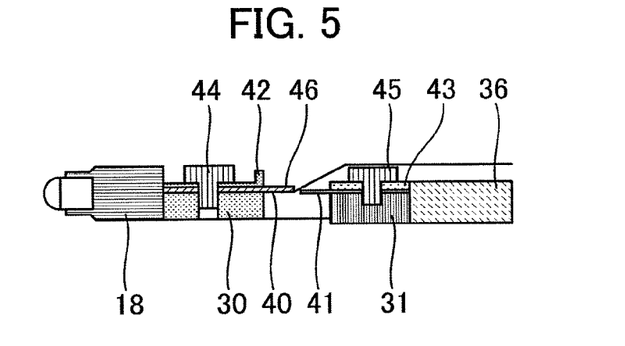
FIG. 5 is a diagrammatic cross sectional view along the line B-B' shown in FIG. 4, being a drawing of the specimen holder for the transmission electron microscopy of the present invention.

FIG. 5 is a cross sectional view along the line B-B' shown in FIG. 4, showing the cross sectional view of the end portion of the specimen holder 18 on which the specimen supports 40 and 41 are fixed.

As described above, the specimen support 40 is arranged on the specimen stage 30, and the damping mechanism 46 and the retainer plate 42 are mounted on the specimen support 40. Thereafter, the specimen support 40 is fixed to the specimen stage 30 by using the fixing screw 44. On the other hand, the specimen support 41 is mounted on the specimen stage 31. Thereafter, the retainer plate 43 is mounted on the specimen support 41, the specimen support 41 being fixed to the specimen stage 31 by the fixing screw 45.

As described above, the specimen stage 31 is arranged on the end portion of the specimen driving rod 36, so that the specimen stage 31 can be driven (moved) by driving (moving) the specimen driving rod 36, and the specimen support 41 to which the specimen is fixed can be moved for an optional position.

Figure 6A:
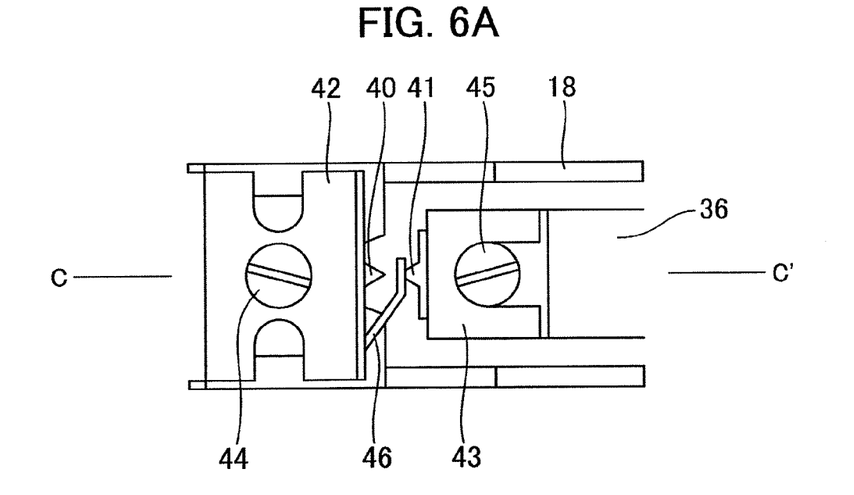
FIG. 6A is a drawing for explaining the operation of the specimen holder according to the present invention.
Figure 6B:
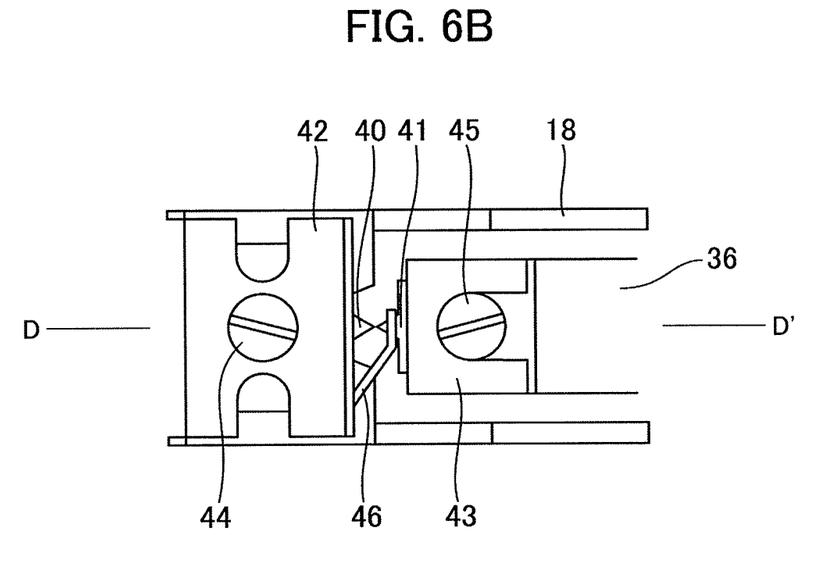
FIG. 6B is a drawing for explaining the operation of the specimen holder according to the present invention.
Figure 7A:
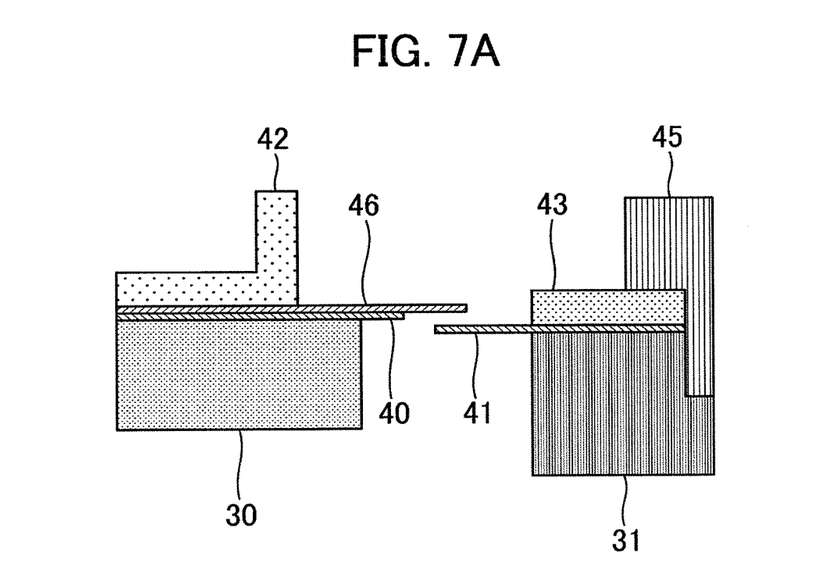
FIG. 7A is a diagrammatic cross sectional view along the line C-C' shown in FIG. 6A, being a drawing of the specimen holder according to the present invention.
Figure 7B:
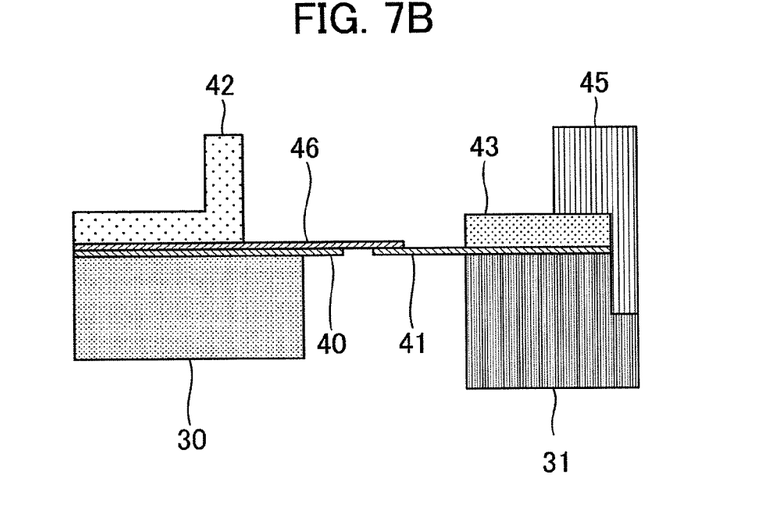
FIG. 7B is a diagrammatic cross sectional view along the line D-D' shown in FIG. 6B, being a drawing of the specimen holder according to the present invention.

FIGS. 6A and 6B are drawings for showing one example for preventing the specimen supports 40 and 41 from vibrating after the specimen supports 40 and 41 to which the specimen is fixed are arranged on the specimen stages 30 and 31, being a drawing of the specimen holder 18 viewed from the upper surface direction. Further, FIGS. 7A and 7B are a cross sectional view along the line C-C' in FIG. 6A and a cross sectional view along the line D-D' in FIG. 6B. FIG. 6A shows the condition before the damping mechanism 46 and the specimen support 41 are contacted with each other, FIG. 6B showing the condition after the damping mechanism 46 and the specimen support 41 are contacted with each other.

The vibration of the specimen support 41 can be prevented or restricted by the condition that the damping mechanism 46 contacts to the specimen support 41.

In FIGS. 6A, 6B, 7A, and 7B, the specimen support 41 can be moved for the specimen support 40 by driving the specimen driving rod 36, and the specimen support 41 can be moved to approach to the damping mechanism 46 installed on the vicinity of the specimen stage 30. When the specimen support 41 is moved to approach the specimen support 40, the specimen support 41 is moved from the lower side of the damping mechanism 46 until the focusing condition of the specimen on the specimen support 41 becomes the focus condition which is nearly equal to the focusing condition of the specimen on the specimen support 40, as shown in FIG. 7A. When the specimen support 41 is moved to approach to the specimen support 40 further, the specimen support 41 is moved to approach the specimen support 40 while the specimen support 41 is contacted to the damping mechanism 46, as shown in FIG. 7B.

The upper and lower relationship between the specimen support 40, retainer plate 42, and the damping mechanism 46 on the specimen stage 30 is not limited to the above relationship. For example, the damping mechanism 46 may be arranged right above the specimen stage 30, and the specimen support 40 may be arranged on the damping mechanism 40, the specimen support 40 being fixed by the retain plate 42. In this case, after the specimen support 41 is moved to approach to the specimen support 40 from the upper portion of the damping mechanism 46, the specimen support 41 may be contacted to the damping mechanism 46.

Further, the retainer plate 42 and the damping mechanism 46 may be integrated with each other in order to reduce the complexity for mounting the retainer plate 42 and the damping mechanism 46 to the specimen stage 30.

Figure 8A:
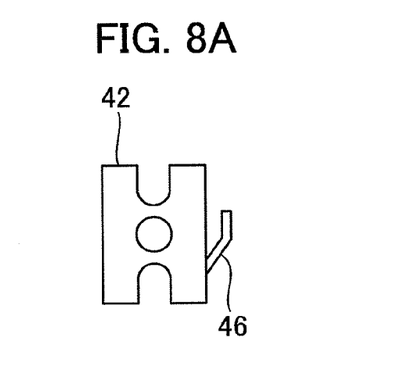
FIG. 8A is a diagrammatical drawing for explaining a modification of the vibration isolation mechanism in the specimen holder of the embodiment according to the present invention.
Figure 8B:
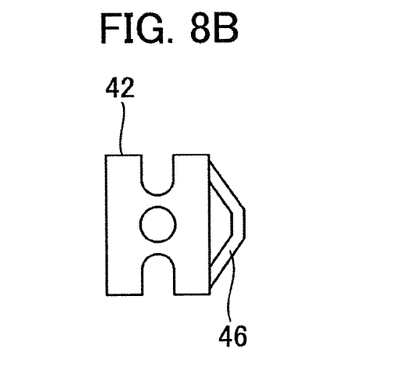
FIG. 8B is a diagrammatical drawing for explaining a modification of the vibration isolation mechanism in the specimen holder of the embodiment according to the present invention.
Figure 8C:
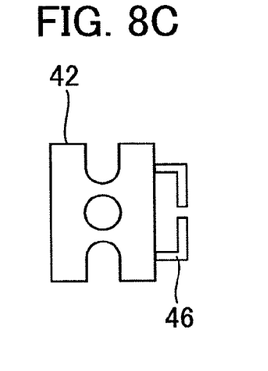
FIG. 8C is a diagrammatical drawing for explaining a modification of the vibration isolation mechanism in the specimen holder of the embodiment according to the present invention.

FIGS. 8A, 8B, and 8C are drawings for showing one example that the retainer plate 42 and the damping mechanism 46 are integrated with each other. FIG. 8A shows the damping mechanism 46 having the shape shown in FIGS. 4 to 6B, FIGS. 8B and 8C showing the shape of the damping mechanism 46 except for the shape shown in FIG. 8A.

In the example shown in FIG. 8A, one end portion of the damping mechanism 46 is connected to the one side surface portion of the retainer plate 46, the example including a portion inclined and extended to one side surface portion of the retainer plate 46 and a portion paralleled and extended to one side surface portion of the retainer plate 46. In this example, the parallel extending portion is contacted to the specimen support 41.

In the example shown in FIG. 8B, the both end portions of the damping mechanism 46 are connected to one side surface portion of the retainer plate 46, the example including portions inclined to one side surface portion of the retainer plate 46 and extending from the both end portions in the direction for approaching with each other and a parallel portion parallel extending to one side surface portion of the retainer plate 46 and joined to the portions extended from the both end portions. In this example, the above-mentioned parallel portion is contacted with the specimen support 41.

In the example shown in FIG. 8C, the both end portions of the damping mechanism 46 are connected to one side surface portion of the retainer plate 46, the example including portions extending in perpendicular direction to to one side surface portion of the retainer plate 46 and extending from the both end portions and parallel portions parallel extending to one side surface portion of the retainer plate 46 and joined to the portions extended from the both end portions. In this example, the above-mentioned parallel portions are contacted with the specimen support 41.

The shape of the damping mechanism 46 can be changed suitable for the shapes of the specimen supports 30 and 31. Further, the material of the damping mechanism 46 is preferably made of a material having elasticity capable for being driven (moved) by the contact with the specimen support 41, being preferably made of an electrical conductivity material in order to avoid the material charged up with the electricity by electron beam. For example, a phosphor bronze or other an electrical conductive and elastic material is suitable for the material of the damping mechanism 46.

According to the above-mentioned damping mechanism 46, one example is to insert the damping mechanism 46, which is separated from the retainer plate, between retainer plate 42 and the specimen stage 30, the other example is to integrate the retainer plate 42 with the damping mechanism 46. Other example is to arrange the damping mechanism 46 in the specimen holder 18, the damping mechanism 46 being separated from the specimen holder 18.

Figure 9:
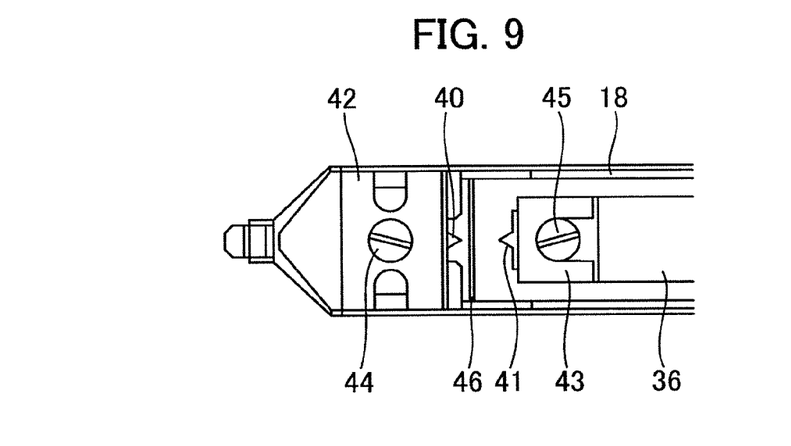
FIG. 9 is a diagrammatical drawing for explaining a further modification of the vibration isolation mechanism in the specimen holder of the embodiment according to the present invention.
Figure 10:
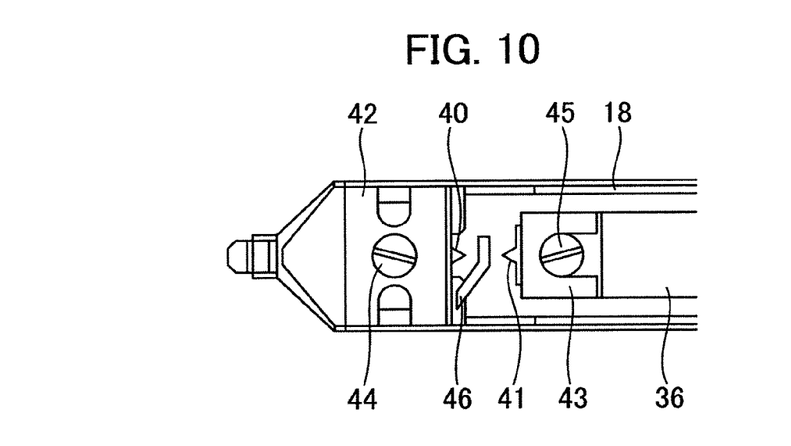
FIG. 10 is a diagrammatical drawing for explaining a further modification of the vibration isolation mechanism in the specimen holder of the embodiment according to the present invention.

FIG. 9 and FIG. 10 are drawings for showing one example in case that the damping mechanism 46 is independently arranged in the specimen holder 18.

In FIG. 9, the damping mechanism 46 is included in the specimen holder 18. The damping mechanism 46 is arranged at the position at which the focusing points of the both specimens on the specimen supports 40 and 41 are matched when the both specimens are observed.

This damping mechanism 46 has rectangular shape, being arranged at vicinity of the specimen support 40. The specimen support 41 is positioned below the damping mechanism 46, being contacted with the damping mechanism 46 by the same manner of the example shown in FIG. 7B to prevent or restrict the vibration of the specimen support 41.

The damping mechanism 46 can be removed from the specimen holder 18.

Further, FIG. 10 shows an example that the damping mechanism 46 is always fixed on the specimen stage 30. The shape of the damping mechanism 46 shown in FIG. 10 is equal to the shape of the damping mechanism 46 shown in FIG. 8A.

In this case, the vibration of the specimen support 41 can be prevented or restricted by contacting the specimen support 41 with the damping mechanism 46.

The shape of the damping mechanism 46 can be made to be equal to the shape shown in FIGS. 8B and 8C in case that the damping mechanism 46 is independently arranged in the specimen holder 18.

Next, it will be described that the example of a specimen observed by using the specimen holder of the above-mentioned embodiment of the present invention.

Namely, the specimen is fixed on the specimen support 41 fixed to the movable specimen driving rod 36 of the specimen holder 18, being observed by using the specimen holder 18 having the above-mentioned damping mechanism 46. The result of the observation of the specimen will be explained herein under. The specimen to be overbid is gold particle deposited on the film of a carbon.

The accelerating voltage of the Transmission Electron Microscopy apparatus 1 is 200 kV, the acceptance angle of the electron beam 3 being 25 m rad, the observation magnifying power being 450 thousand times, when the image of the Transmission Electron Microscopy is observed.

Figure 11A:
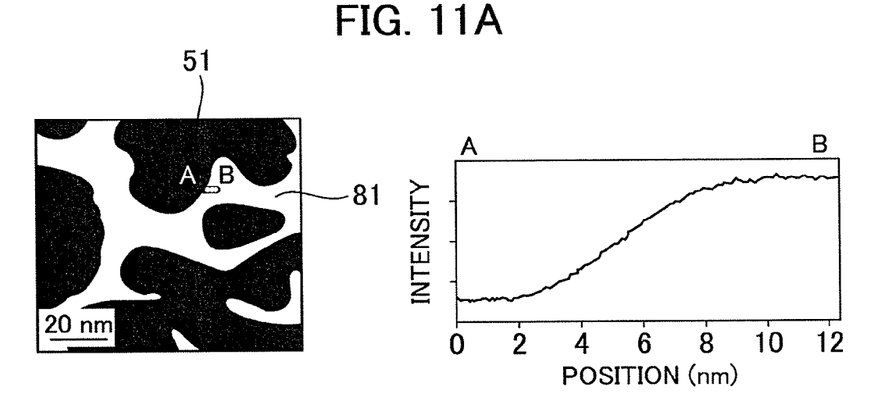
FIG. 11A is a drawing for showing a high-magnification transmission electron microscopy obtained by using a technique different from the present invention.
Figure 11B:
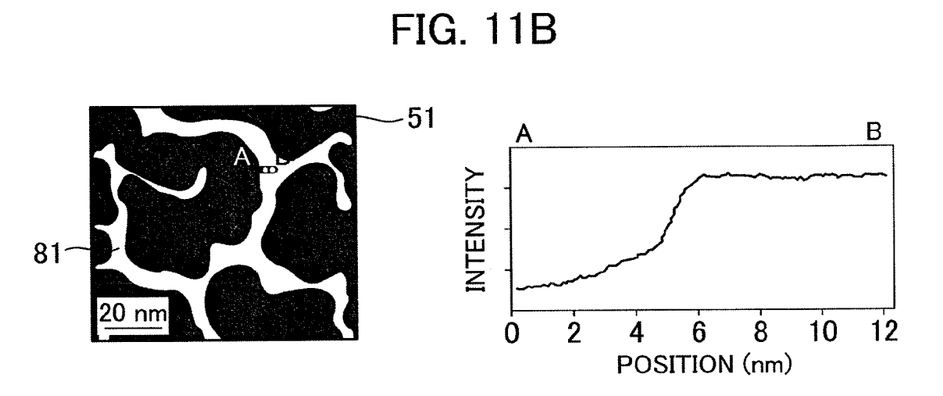
FIG. 11B is a drawing for showing a high-magnification transmission electron microscopy obtained by using the specimen holder of the embodiment according to the present invention.

The observation results under this condition are shown in FIGS. 11A and 11B. FIG. 11A is a Transmission Electron Microscopy image obtained by the specimen observation by using the specimen holder 18 without the damping mechanism 46 of the embodiment of the present invention.

FIG. 11B is a Transmission Electron Microscopy image obtained by the specimen observation by using the specimen holder 18 of the embodiment of the present invention.

In FIG. 11A and FIG. 11B, dark portions are gold particles 51, bright portions being carbon film 81.

In FIG. 11A, the boundary between the gold particles 51 and the carbon film 81 becomes diffuse image. This means that the drift of the specimen is occurred during the specimen observation. However, as shown in FIG. 11B, the boundary between the gold particles 51 and the carbon film 81 becomes clear image and the drift of the specimen is reduced in case that the Transmission Electron Microscopy image is obtained by using the damping mechanism 46 of the specimen holder 18 according to the present invention.

The right sides of FIG. 11A and FIG. 11B show the graphs representing the relationship between the position and the intensity (light intensity) of the image portions denoted by A and B in the left sides of FIG. 11A and FIG. 11B respectively. In case of the example shown in FIG. 11A, the shape of the curve is a gentle inclined line from position 2 nm to 8 nm.

On the other hand, the intensity suddenly becomes large from about 4.5 nm to 6 nm shown in FIG. 11B showing the example to which the present invention is applied.

It is apparent from the comparison of the examples shown in FIGS. 11A and 11B that the visibility of image of the example in FIG. 11B showing the present invention can be understood to be improved in comparison with the visibility of image of the example in FIG. 11A.

Next, the concrete examples of the spectrum images of plurality of specimens obtained at the same time are shown. In the concrete examples described below, the Transmission Electron Microscopy apparatus 1 and the specimen holder 18 of the embodiment according to the present invention are used to obtain the spectrum images from two specimens and to measure the chemical shift of the electron energy loss spectrum obtained from two spectrum images.

The specimens to be observed are particles of Anhydrous Ferric Oxide ($Fe_2O_3$) (measurement specimen A) and Iron Oxide (FeO) (measurement specimen B) fixed to the specimen supports 40 and 41 respectively by using the focusing ion beam apparatus.

The specimen support, to which the measurement specimen A is fixed, is the specimen supports 40 set on the end portion side of the specimen holder 18, i.e. the specimen stage 30, the specimen support, to which the measurement specimen B is fixed, is the specimen supports 41 set on the specimen driving rod 36 side, i.e. the specimen stage 31.

Further, the accelerating voltage of the Transmission Electron Microscopy apparatus 1 is 200 kV, the acceptance angle of the electron beam 3 being 6 m rad, the dispersion of energy being 0.05 eV/picture element, when the spectrum image of specimen is obtained. The image detector 13 used for obtaining the spectrum image is a 1024 elements×1024 elements two dimensional detector.

First, the observation magnifying power of the Transmission Electron Microscopy apparatus 1 is made to be 200 times, the specimen support 41 being moved by using the coarse driving part 19 to approach the measurement specimen B to the measurement specimen A as much as possible. The both of the specimens A and B are moved in order to arrange the specimens on the center portion of the fluorescent screen 9 as much as possible by using the image on the fluorescent screen 9 to confirm the positions of the specimens A and B.

Next, the observation magnifying power of the screen display of the image display apparatus 14 in the Transmission Electron Microscopy apparatus 1 is changed to 10000 times from 200 times, the measurement specimen B is moved in order to make the measurement specimen A and measurement specimen B to be orthogonal against the energy dispersion axis of the electron spectroscope 8. Thereafter, the measurement specimen B is made to further approach to the measurement specimen A by the specimen moving apparatus 20 using the specimen driving rod 36 or the like in order to obtain the spectrum images of the measurement specimens A and B at the same time.

In this occasion, the positions of the specimens A and B are confirmed by the Transmission Electron Microscopy image obtained by the image detector 13. Further, it is confirmed by the Transmission Electron Microscopy images of the both specimens A and B that a specimen drift is not occurred.

Next, the observation magnification factor is changed to 50000 times from 10000 times, the spectrum images of the measurement specimen A and the measurement specimen B being obtained at the same time. The spectrum image is obtained at the L shell absorption edge area of Iron.

In the spectrum image obtained at the L shell absorption edge area of Iron, electron energy loss spectrum being extracted from each of the specimens A and B. The chemical shifts of both specimens A and B are measured after the electron energy loss spectrums are extracted. As the result, it is recognized that the chemical shift of Anhydrous Ferric Oxide is shifted with about 1.5 eV high loss energy side in comparison with Iron Oxide.

In the prior art, it was difficult to measure the chemical shift between particles with high accuracy and high spatial resolution. The chemical shift between particles can be measured by the present invention.

As described above, according to the present invention, the electron energy loss spectrums can be obtained from a plurality of specimens at the same time with high spatial resolution, so that the measurement area of the chemical shift of a specimen, which was difficult to measure the chemical shift, can be expanded. For example, the chemical shift in one particle can be measured with high accuracy.

Next, the specification describes the concrete example of the image obtained by executing the electron diffraction of a plurality of specimens described above at the same time by using the specimen holder according to the present invention. In the concrete example of the image, the electron diffraction images are obtained from two specimens at the same time by using the Transmission Electron Microscopy apparatus 1 to which the specimen holder 18 of the present invention is applied.

The measurement specimens are gold particle deposited on the carbon film (measurement specimen S), and thin section specimen of the Transmission Electron Microscopy specimen made of the silicon substrate thinned by a focus ion beam apparatus (measurement specimen T), being set on the specimen supports 41 and 40 respectively.

The accelerating voltage of the Transmission Electron Microscopy apparatus 1 is 200 kV, and the length of a camera is 0.8 m when electron diffraction image is obtained. The image detector 13 used for obtaining the electron diffraction image is a 1024 elements×1024 elements two dimensional detector.

The measurement specimen S is moved into the irradiation area of the electron beam 3 by the coarse driving part 19 with the confirmation of low magnification factor as same as the spectrum image obtaining operation. Thereafter, the specimen Ss is moved by using the coarse driving part 19 to further approach the measurement specimen S to the measurement specimen T as much as possible. The both of the specimens S and T are moved in order to arrange the specimens on the center portion of the fluorescent screen 9 as much as possible by using the image on the fluorescent screen 9 to confirm the positions of the specimens S and T. Further, measurement specimen S is moved in order to coincide with the focus positions of both specimens S and T.

Next, the observation magnifying power of the screen display of the image display apparatus 14 in the Transmission Electron Microscopy apparatus 1 is changed to 10000 times from 200 times, the positions of the measurement specimens S and T being adjusted by the specimen moving apparatus 20 in order to observe the measurement specimens S and T in the restriction filed stop 50 at the same time and to coincide the focusing positions of the specimens S and T with each other.

In this occasion, the Transmission Electron Microscopy images of both specimens S and T are obtained at the time when the focus points of the both specimens are equal with each other, as same as the spectrum image obtaining operation. It is confirmed that there is no blurred image occurred by a drift of a specimen in the obtained Transmission Electron Microscopy images.

Figure 12:
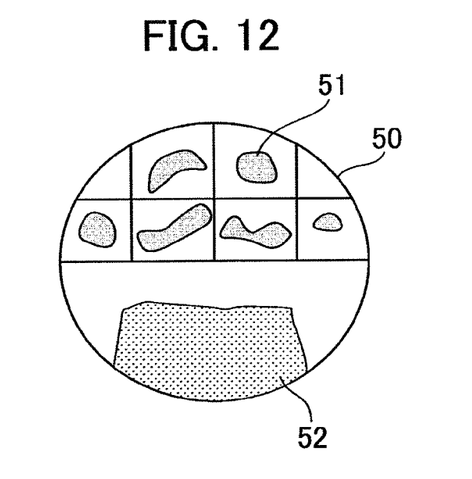
FIG. 12 is a drawing for showing the transmission electron microscopy obtained by using the specimen holder of the embodiment according to the present invention.

FIG. 12 shows the Transmission Electron Microscopy image obtained by observing the measurement specimen S and measurement specimen T in the restriction field stop 50 at the same time. The gold particle 51, which is the measurement specimen S, is observed in the upper portion of the restriction field stop 50 shown in FIG. 12, the silicon substrate 52, which is the measurement specimen T, is observed in the lower portion of the restriction field stop 50.

The current value of the image lens system 7 is changed in order to obtain an electron diffraction image after it is confirmed that both of the specimens S and T are arranged in the restriction field stop 50.

Figure 13:
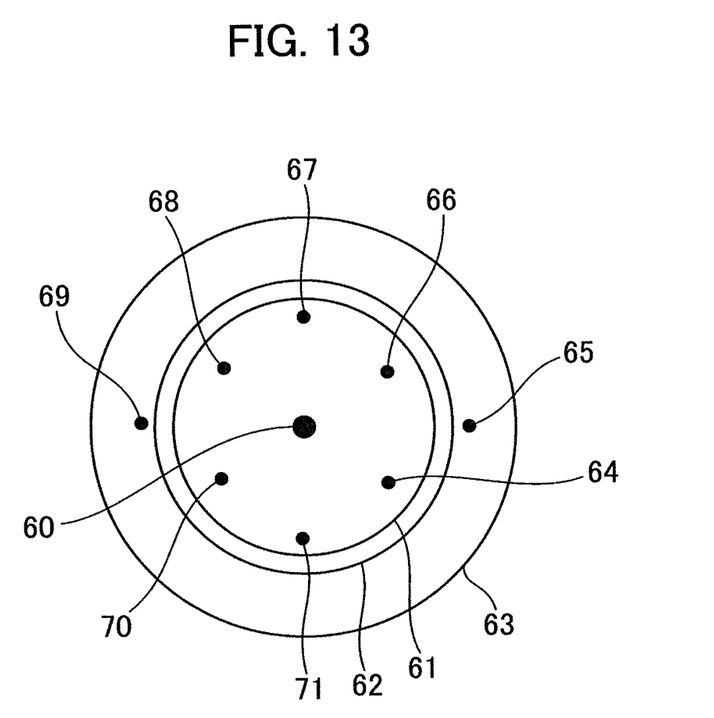
FIG. 13 is a drawing for showing the electron diffraction image obtained by using the specimen holder of the embodiment according to the present invention.

FIG. 13 shows the electron diffraction image obtained by the image detector 13. In FIG. 13, the electron diffraction images 61 to 63 are diffraction images obtained from the gold particle 51, the electron diffraction images 64 to 71 being diffraction images obtained from the silicon substrate 52. Further, the electron diffraction image 60 is a center spot.

According to the present invention, the electron diffraction images can be obtained from both of the measurement specimen S and the measurement specimen T. Further, a single electron diffraction image can be obtained by leaving one specimen in the restriction field stop 50 after the electron diffraction images of both specimens S and T, so that the length of the camera can be corrected in case that the structure of an unknown measurement specimen is analyzed by using an electron diffraction image.

The present invention can realize a specimen holder used in a charged-particle beam apparatus, the specimen holder arranging a plurality of specimens, at least one of specimen supports of the specimen holder being moved, the specimen holder being capable for obtaining Transmission Electron Microscopy images, electron diffraction images, spectrum images, or the like from all specimens arranged on the specimen supports with high spatial resolution power.

Further, the present invention can realize an image detection method capable for detecting two dimensional image of a specimen by the charged-particle beam apparatus using the above-mentioned specimen holder used in a charged-particle beam apparatus.

Further, the present invention can realize a charged-particle beam apparatus using the above-mentioned specimen holder used in a charged-particle beam apparatus.

These method and apparatus can obtain the effect for obtaining a Transmission Electron Microscopy image, an electron diffraction image, a spectrum image, or the like.

Further, in the embodiments of the present invention, there has been described that the specimen holder 18 is applied for measuring the electron energy loss spectrum and the electron diffraction. The present invention is not limited to the above-mentioned embodiments.

For example, the specimen support 41 is moved by moving the specimen stage 31 by the specimen driving rod 36 in order to approach the specimen stage 31 to the specimen support 40. The specimen stage 30, however, may has a rod equal to the specimen driving rod 36, and the specimen support can be moved.

Further, the construction of other embodiment of the present invention is that a plurality of specimens is arranged on a movable and single specimen support to be moved by the specimen driving rod. There is an example constructed to form the vibration damping mechanism 46 for damping the vibration of the specimen support on the specimen holder 18.

While the present invention has been described concretely on the basis of the embodiments, it will be understood that various modification may be made within the scope of the invention.

DESCRIPTION OF REFERENCE NUMERALS

1 . . . Transmission Electron Microscopy apparatus,
2 . . . Electron source,
3 . . . Electron beam,
4 . . . Convergent lens,
6 . . . Objective lens,
7 . . . Image lens system,
8 . . . Electron spectroscope,
9 . . . Fluorescent screen,
10 . . . Magnetic sector,
11, 12 . . . Multiple lenses,
13 . . . Image detector, 14 . . . Image display apparatus,
15 . . . Data storage apparatus,
16 . . . Central control apparatus,
17 . . . Filed view restriction slit,
18 . . . Specimen holder used for Transmission Electron Microscopy,
19 . . . Coarse driving part,
20 . . . Sample pipetting mechanism,
21, 22 . . . Specimen,
30, 31 . . . Specimen stage,
36 . . . Specimen driving rod,
38 . . . Screw holes,
40, 41 . . . Specimen support,
42, 43 . . . Retainer plate,
44, 45 . . . Fixing screw,
46 . . . Damping mechanism,
50 . . . Restriction field stop,
51 . . . Gold particle image,
52 . . . Silicon substrate image,
60 . . . Center spot,
61-71 . . . Electron diffraction image,
81 . . . Carbon film

The invention claimed is:

1. A specimen holder for a charged-particle beam apparatus for supporting specimens, being installed in the charged-particle beam apparatus obtaining information of plural specimens at a same time to observe the specimens, comprising:
  a plurality of specimen supports, each of the specimen supports having one of the specimens, which are different from each other, arranged thereon;
  a specimen driving part for moving at least one of the specimen supports; and
  a vibration damping mechanism for restricting a vibration of said specimen support moved by the specimen driving part,
  wherein the plurality of specimen supports include a first specimen support moved by the specimen driving part and a second specimen support fixed on the specimen holder, such that the second specimen support is not movable by the specimen driving part,
  the specimen driving part moves the first specimen support to approach to the second specimen support so as to irradiate an electron beam onto both of specimens arranged on the first specimen support and the second specimen support at the same time and to coincide focusing areas of the electron beam of both specimens with each other,
  the vibration damping mechanism is fixed to a second specimen support side of the specimen holder, has a flat plate-like shape, and has a contact surface contacting to an upper surface or a lower surface of the first specimen support when the first specimen support and the second specimen support are arranged in close proximity with each other, and
  a space is formed between the damping mechanism and the second specimen support, and the space is formed so as to coincide the focusing areas of both specimens with each other when the first specimen support and the second specimen support are arranged in close proximity with each other.

2. A specimen holder for a charged-particle beam apparatus according to claim 1, further comprising:
  a first specimen stage for supporting the first specimen support;
  a second specimen stage for supporting the second specimen support;
  a first retainer plate for fixing the first specimen support to the first specimen stage,
  a second retainer plate for fixing the second specimen support to the second specimen stage,
  wherein the vibration damping mechanism and the first specimen support are fixed to the first specimen stage by the first retainer plate.

3. A specimen holder for a charged-particle beam apparatus according to claim 1, wherein
  the specimen driving part moves the first specimen support in condition that the specimen holder is fixed to the charged-particle beam apparatus.

4. A specimen holder for a charged-particle beam apparatus according to claim 1, wherein
  the vibration damping mechanism is separated from the first specimen support and the specimen driving part, being fixed to the specimen holder.

5. A charged-particle beam apparatus obtaining information of plural specimens at a same time to observe specimens, comprising:
  an electron source for generating an electron beam;
  a specimen holder for a charged-particle beam apparatus, the specimen holder having a plurality of specimen supports, each of the specimen supports having one of the specimens, which are different from each other, arranged thereon, a specimen driving part for moving at least one of the plurality of specimen supports, and a vibration damping mechanism for restricting vibration of the specimen support moved by the specimen driving part;
  a convergent lens for converging the electron beam generated from the electron source to the specimens arranged on the specimen holder for a charged-particle beam apparatus;
  an electron spectroscope for making a spectrum of the electron beam passing through the specimen;
  an image detector for detecting an image of the specimen on the basis of the electron beam through the electron spectroscope; and
  an image display apparatus for displaying an image detected by the image detector,
  wherein the plurality of specimen supports include a first specimen support moved by the specimen driving part and a second specimen support fixed on the specimen holder, such that the second specimen support is not movable by the specimen driving part,
  the specimen driving part moves the first specimen support to approach to the second specimen support so as to irradiate the electron beam onto both of specimens arranged on the first specimen support and the second specimen support at the same time, and to coincide focusing areas of the electron beam of both specimens with each other,
  the vibration damping mechanism is fixed to a second specimen support side of the specimen holder, has a flat plate-like shape, and has a contact surface contacting to an upper or a lower surface of the first specimen support in condition that the first specimen support and the second specimen support are arranged in close proximity with each other, and
  a space is formed between the damping mechanism and the second specimen support, and the space is formed so as to coincide the focusing areas of both specimens with each other when the first specimen support and the second specimen support are arranged in close proximity with each other.

* * * * *